United States Patent
Miller (10) Patent No.: US 9,692,414 B2
(45) Date of Patent: Jun. 27, 2017

(54) CROWBAR CURRENT ELIMINATION

(71) Applicant: Lattice Semiconductor Corporation, Hillsboro, OR (US)

(72) Inventor: Edward Miller, Beaverton, OR (US)

(73) Assignee: Lattice Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/793,788

(22) Filed: Jul. 8, 2015

(65) Prior Publication Data

US 2017/0012624 A1    Jan. 12, 2017

(51) Int. Cl.
*H03K 17/00*    (2006.01)
*H03K 19/00*    (2006.01)

(52) U.S. Cl.
CPC .............................. *H03K 19/0013* (2013.01)

(58) Field of Classification Search
CPC .............................. H03K 17/00; H03K 17/687
See application file for complete search history.

(56) References Cited

U.S. PATENT DOCUMENTS

| | | | | |
|---|---|---|---|---|
| 4,518,880 A | * | 5/1985 | Masuda | H03K 5/249 327/383 |
| 5,471,150 A | * | 11/1995 | Jung | H03K 19/0013 326/121 |
| 7,312,626 B2 | * | 12/2007 | Forbes | H03K 19/0013 257/E27.016 |
| 2007/0046330 A1 | | 3/2007 | Forbes | |

* cited by examiner

*Primary Examiner* — Hai L Nguyen
(74) *Attorney, Agent, or Firm* — Michael Garrabrants (57) ABSTRACT

In one embodiment, an inverter generates an inverted clock signal using (i) first P-type and N-type transistors connected in cascode between supply and ground nodes and (ii) control circuitry receiving different phase-offset input clock signals that ensure that the cascode-connected transistors are never even partially on at the same time, thereby preventing crowbar current from occurring through the cascode-connected devices. In one implementation, the control circuitry has two P-type transistors and two N-type transistors configured to receive three phase-offset input clock signals to prevent crowbar current in the inverter. The control circuitry has pass transistors that selectively allow one of the phase-offset input signals to be applied to the gate of one of the cascode-connected transistors with minimal delay, thereby enabling the inverter to operate properly over a relatively wide range of input clock frequencies.

15 Claims, 9 Drawing Sheets

TABLE I

| TIME | PH1 | PH2 | PH3 | P1 | P2 | P3 | N1 | N2 | N3 | CLKB |
|---|---|---|---|---|---|---|---|---|---|---|
| t0 | LOW | HIGH | LOW | ON | OFF | ON | OFF | ON | OFF | HIGH |
| t1 | L→H | HIGH | LOW | →OFF | OFF | ON | →ON | ON | OFF | HIGH |
| t2 | HIGH | H→L | LOW | OFF | →ON | →OFF | ON | →OFF | OFF | HIGH |
| t3 | HIGH | LOW | L→H | OFF | ON | OFF | ON | OFF | →ON | →LOW |
| t4 | HIGH | LOW | HIGH | OFF | ON | OFF | →OFF | OFF | ON | LOW |
| t5 | H→L | LOW | HIGH | →ON | →OFF | OFF | OFF | →ON | →OFF | LOW |
| t6 | LOW | L→H | HIGH | ON | OFF | →ON | OFF | ON | OFF | →HIGH |
| t7 | LOW | HIGH | H→L | ON | OFF | ON | OFF | ON | OFF | HIGH |
| t8 | LOW | HIGH | LOW | ON | OFF | ON | OFF | ON | OFF | HIGH |
| t9 | L→H | HIGH | LOW | →OFF | OFF | ON | →ON | ON | OFF | HIGH |

CROWBAR CURRENT ELIMINATION

BACKGROUND

Field of the Invention

The present invention relates to electronics and, more specifically but not exclusively, to schemes for avoiding crowbar current in CMOS micropower circuits.

Description of the Related Art

This section introduces aspects that may help facilitate a better understanding of the invention. Accordingly, the statements of this section are to be read in this light and are not to be understood as admissions about what is prior art or what is not prior art.

Modern integrated circuit design is dominated by complementary metal oxide semiconductor (CMOS) technology, which combines N-type MOS (NMOS) and P-type MOS (PMOS) transistors in addition to a smaller number of other structures which add design flexibility. Micropower circuits such as bandgaps, low-power oscillators, and other analog circuits operate at bias currents of a few nanoamps or less, which results in slow rise/fall times at internal nodes due to unavoidable parasitic capacitances. The slew rate for a capacitor is set by the equation $\Delta v/\Delta t = -i/c$. At current $i=1$ nA, an internal node with total capacitance of only $c=1$ fF has a slew rate $\Delta v/\Delta t$ of only 1 v/µs. This is extremely slow compared to sub-100 ps gate delays in modern technologies. (1 µs=1×10$^6$ ps.) Within the analog circuitry of a micropower product, the slow transitions are not usually an issue because the designs are developed using long gate-length devices and limiting bias currents to maintain low-power operation. Also, many analog circuits are designed to provide reference voltages or other static voltages or currents for use in other circuits, not to generate switching-circuit operation as is done in clocked circuits. A low-power oscillator required to operate at sub-µA currents presents a challenge due to its output switching behavior required to drive some clocked, digital circuits.

The transition from slow rise/fall times within micropower analog circuitry to fast rise/fall times required to clock digital circuits is the challenge for maintaining very low-power operation. Slow rise/fall times at the gates of digital cells such as inverters can result in very significant time per clock cycle during which both PMOS and NMOS transistors are conducting. The PMOS is sourcing current from the positive supply while the NMOS is sinking current to the negative supply, resulting in significant loss of current needed to drive the load at the gate output. This is known as crowbar current, which is frequently a significant part of CMOS dynamic power, especially when the voltage transitions at the inverter gates are weak. This crowbar current should be eliminated in order to deliver all the driver current to the load and maintain a total current sufficiently low to achieve micropower operation.

For micropower circuits such as oscillators that respond over several orders of magnitude in frequency range, any crowbar reduction scheme should likewise scale in frequency or the scheme will fail over part of the range of operation.

Figure 1:
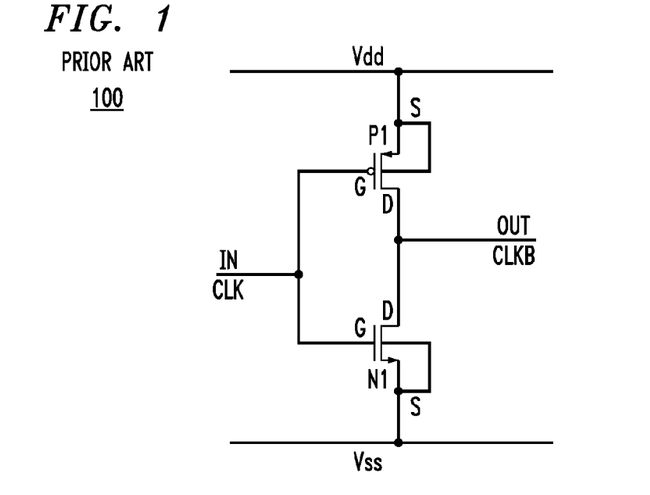
FIG. 1 is a schematic circuit diagram of a conventional inverter.

FIG. 1 is a schematic circuit diagram of a conventional inverter 100 that converts an input clock signal CLK applied at the input node IN into an inverted clock signal CLKB appearing at the output node OUT. Inverter 100 comprises a P-type transistor P1 connected in cascode to an N-type transistor N1 between a supply voltage Vdd and a ground voltage Vss. In particular, the source of P1 is connected to Vdd, the drain of P1 is connected to OUT, and the gate of P1 is connected to IN. Similarly, the source of N1 is connected to Vss, the drain of N1 is connected to OUT, and the gate of N1 is connected to IN. If the input clock signal CLK has relatively slow transitions from low to high and from high to low, then, during those transitions, both P1 and N1 will be at least partially on, and a crowbar current will flow between Vdd and Vss through P1 and N1.

Figure 2:
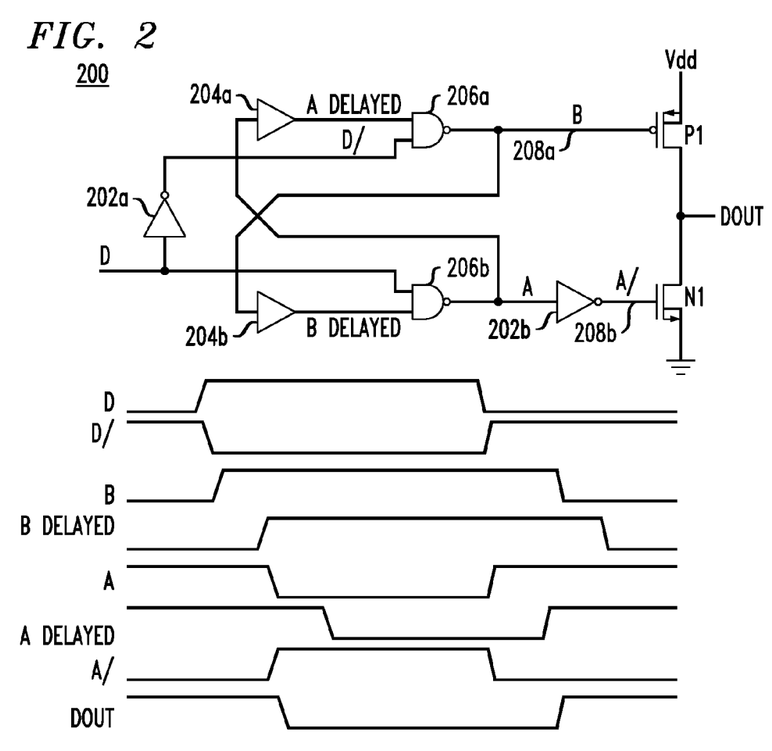
FIG. 2 is a schematic circuit diagram of and timing diagrams for a prior-art inverter that employs cross-coupled logic gates for reduction of crowbar current.

FIG. 2 is a schematic circuit diagram of a prior-art inverter 200 that employs cross-coupled logic gates 206a and 206b for reduction of crowbar current, often used in input/output (I/O) drivers handling large capacitive loads. Two signal paths 208a and 208b are generated using inverters 202a and 202b, non-inverting delay cells 204a and 204b, and the cross-coupled NAND gates 206a and 206b to disable the NMOS N1 before the PMOS P1 is turned on to drive the load voltage DOUT high, and conversely to disable the PMOS P1 before the NMOS N1 is turned on to drive the load voltage DOUT low.

As shown in the timing waveforms at the bottom of FIG. 2, when D is initially low, then signal A is forced high by the NAND gate 206b, and signal A/ (i.e., inverted A) is forced low by the inverter 202b. The non-inverting delay cell 204a sends a high state of the signal A delayed to an input of the NAND gate 206a. Since D/ (i.e., inverted D) and A delayed are both high, the output B of the NAND gate 206a is low. Signal B delayed by the non-inverting delay cell 204b at an input of the NAND gate 206b is held low and will remain low for a delay time after B switches state, so node A is held high until the delay time has ended. In this state, PMOS P1 is conducting, NMOS N1 is shut off, and the output DOUT is driven to VDD. The high state of A delayed allows a transition of D to high driving D/ to low to allow a transition of B from low to high without further delay, turning off P1. Since B delayed is still low, A is held high so A/ is low and NMOS N1 is still disabled. After the delay of B, node B delayed rises. Since D and B delayed are now both high, node A is driven low so A/ is driven high to turn on N1 and drive DOUT to ground GND.

This technique has two limitations where a wide frequency range is required. First, the inverters 202a and 202b, the delay elements 204a and 204b, and the logic gates 206a and 206b for this technique have fixed delays for any given set of conditions such as power supply voltage, temperature, and process variation. The fixed delays severely limit the upper range of operation. Second, the cross-coupled logic gates 206a and 206b themselves will have significant crowbar currents if they are driven directly by slow rise/fall time signals.

A second crowbar-elimination technique is described in U.S. patent publication no. 2007/0046330 A1, the teachings of which are incorporated herein by reference. This technique includes resistor and diode components with the claim that (with appropriate selection of device parameters) the time constant of the RC combination of the resistor and the driver gate capacitance will transition one gate turn-on at a substantially slower speed than the turn-off transition at the other gate through a diode. This will reduce the crowbar current. Similar to the first technique, the timing response of these components is fixed by design and can be effective only over a very limited range of frequencies or pulse widths.

SUMMARY

In one embodiment, the present invention is circuitry comprising (i) a first P-type transistor and a first N-type transistor connected in cascode between a supply node and a ground node and (ii) control circuitry connected to generate gate voltages for the first P-type and N-type transistors based on a plurality of phase-offset input signals that ensure that (i) the first P-type transistor is turned off before the first N-type transistor is turned on and (ii) the first N-type transistor is turned off before the first P-type transistor is turned on. The control circuitry comprises pass-transistor circuitry that selectively applies one of the phase-offset input signals either to a gate of the first P-type transistor or to a gate of the first N-type transistor.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 3:
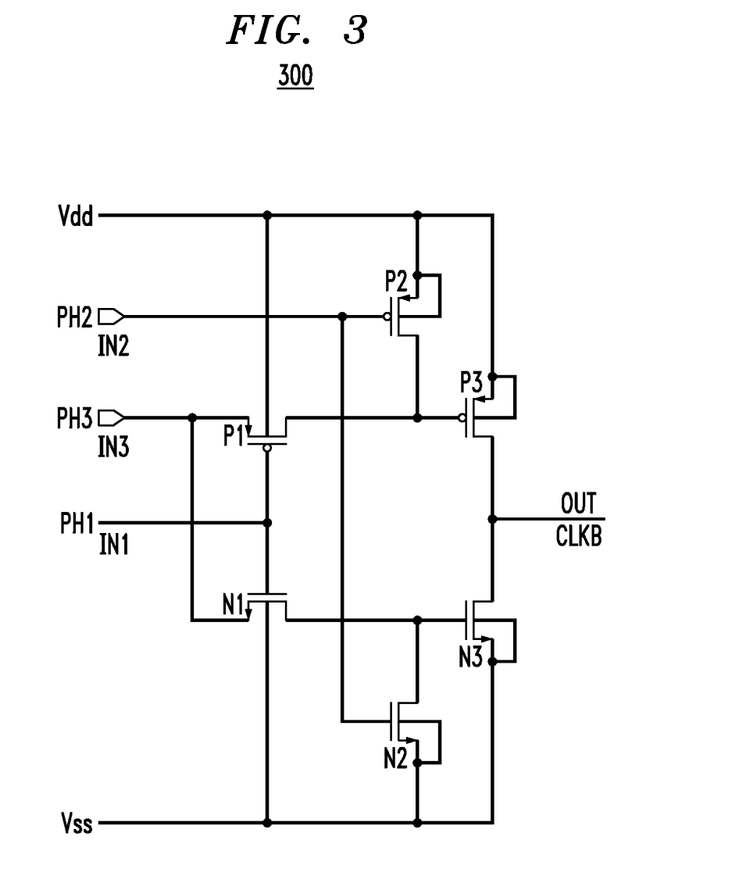
FIG. 3 is a schematic circuit diagram of an inverter according to one embodiment of the invention.

FIG. 3 is a schematic circuit diagram of an inverter 300 according to one embodiment of the invention. Inverter 300 generates an inverted clock signal CLKB appearing at output node OUT based on three different phases PH1, PH2, and PH3 of an input clock signal that are applied at three different input nodes IN1, IN2, and IN3, respectively.

Inverter 300 comprises three P-type transistors P1, P2, and P3 and three N-type transistors N1, N2, and N3. In one implementation, inverter 300 is implemented with metal oxide semiconductor (MOS) devices, although other implementations may be implemented with other types of transistor devices.

As shown in FIG. 3, devices P3 and N3 are connected in a similar cascode manner as devices P1 and N1 of FIG. 1, except that their gates are not shorted together. Instead, the gate of P3 is connected to the drains of P1 and P2, while the gate of N3 is connected to the drains of N1 and N2. Meanwhile, the sources of P1 and N1 are connected to IN3, the gates of P1 and N1 are connected to IN1, the gates of P2 and N2 are connected to IN2, the source of P2 is connected to Vdd, and the source of N2 is connected to Vss.

Figure 4:
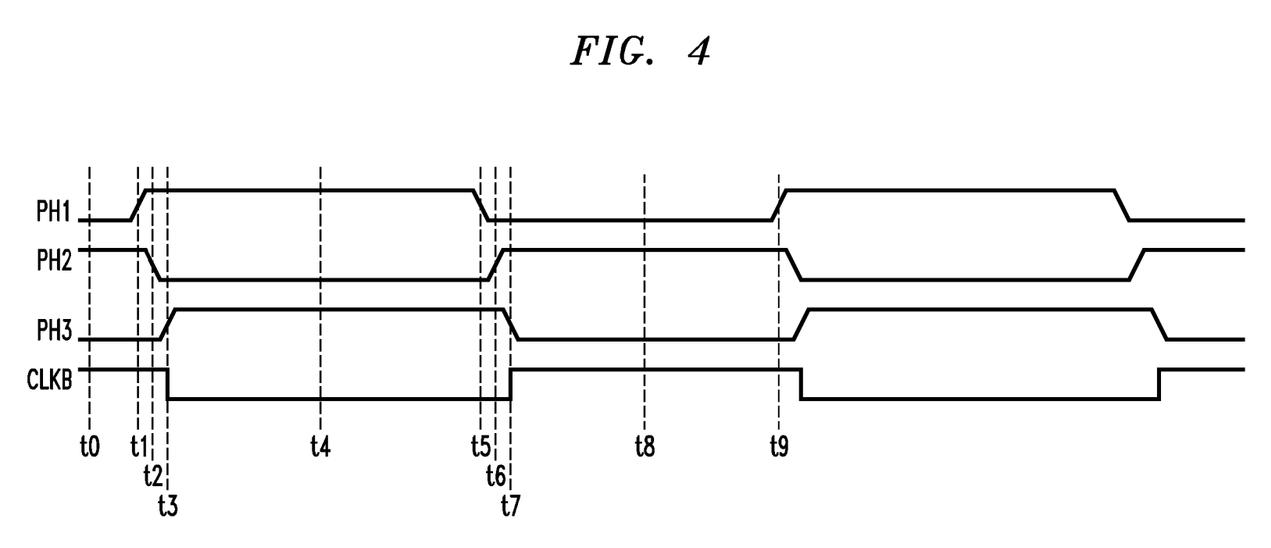
FIG. 4 is a timing diagram showing the relative timing of the three different, phase-offset, input clock signals PH1, PH2, and PH3 of FIG. 3.

FIG. 4 is a timing diagram showing the relative timing of the three different, phase-offset, input clock signals PH1, PH2, and PH3. At time t0, PH1 is low (i.e., at or near Vss), PH2 is high (i.e., at or near Vdd), and PH3 is low. Time stamps t1, t2, t3, t5, t6, t7, and t9 reflect the midpoint of transitions of their associated signals. There may or may not be a positive delay from the end of a transition in one input clock signal to the midpoint of a transition in the next input clock signal, but this will usually be the case as reflected in the description in this paragraph. At time t1, PH1 rises from low to high. At time t2, some duration after PH1 has finished rising, PH2 falls from high to low. At time t3, some duration after PH2 has finished falling, PH3 rises from low to high. At time t4, PH1 is high, PH2 is low, and PH3 is high. At time t5, PH1 falls from high to low. At time t6, some duration after PH1 has finished falling, PH2 rises from low to high. At time t7, some duration after PH2 has finished rising, PH3 falls from high to low. At time t8, like time t0, PH1 is low, PH2 is high, and PH3 is low. Starting at time t9, the sequence is repeated for the next duty cycle of the phase-offset clocks PH1, PH2, and PH3.

Figure 5:
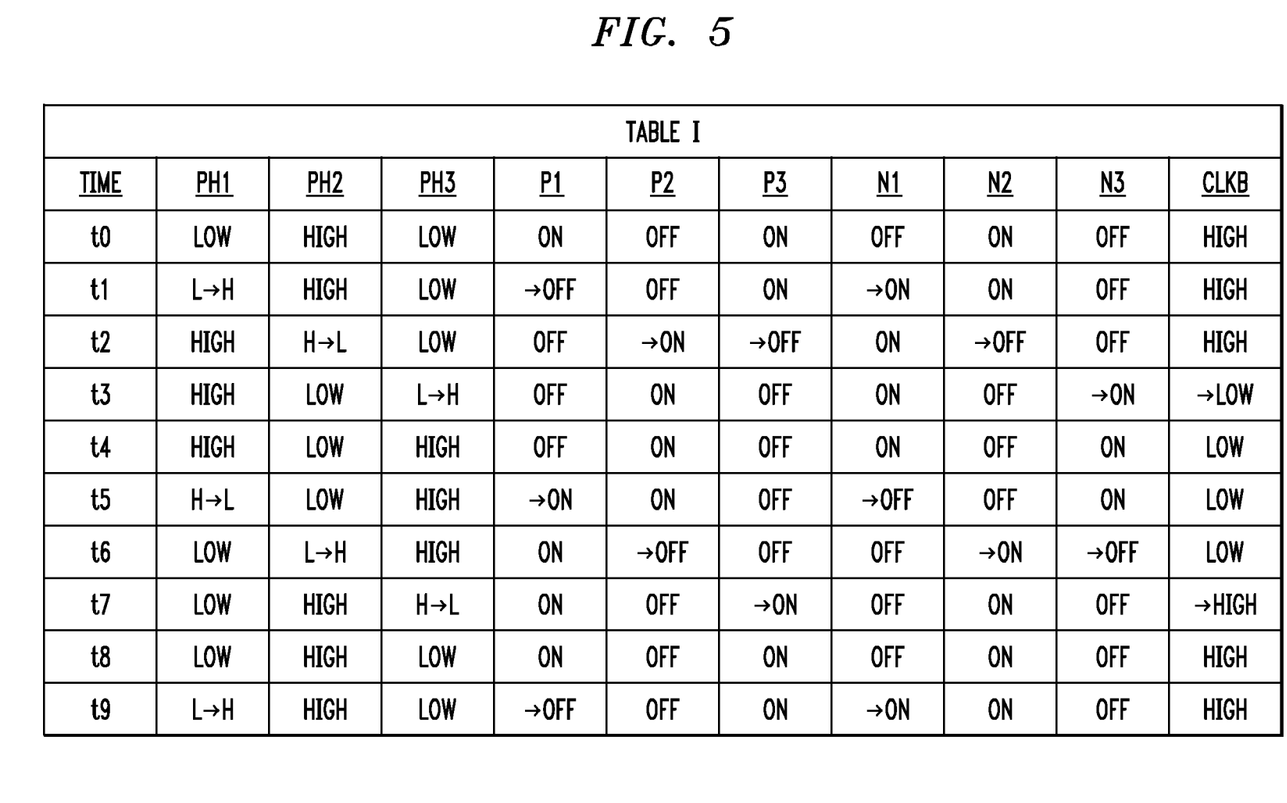
FIG. 5 is Table I, which tabulates the states of the different transistors P1-P3 and N1-N3 of the inverter of FIG. 3 for the different combinations of the input clocks PH1, PH2, and PH3 at the different times t0-t9 shown in FIG. 4 and the corresponding value of the output clock CLKB appearing at output node OUT of FIG. 3.

There architecture of inverter 300 of FIG. 3 and the timing of the clock signals PH1, PH2, and PH3 of FIG. 4 prevent crowbar currents from occurring in inverter 300. FIG. 5 is Table I, which tabulates the states of the different transistors P1-P3 and N1-N3 of inverter 300 for the different combinations of input clocks PH1, PH2, and PH3 at the different times t0-t9 shown in FIG. 4 and the corresponding value of the output clock CLKB appearing at output node OUT.

For example, at time t0, PH1 and PH3 are low, and PH2 is high. Since PH1 is low, P1 is on, and N1 is off. Since PH2 is high, P2 is off, and N2 is on. Since N1 is off and N2 is on, Vss is applied to the gate of N3 via N2, and N3 is off. Since P1 is on and P2 is off, PH3 is applied to the gate of P3 via P1. Since PH3 is low, P3 is on, and Vdd is applied to OUT via P3. As such, at time t0, CLKB is high.

At time t1, PH1 goes from low to high, which turns off P1 and turns on N1. With both N1 and N2 on and PH3 low, N3 will stay off. Meanwhile, with the gate of P3 previously low and with P2 staying off, turning off P1 keeps the now-floating gate of P3 low, which keeps P3 on and CLKB high.

At time t2, PH2 goes from high to low, which turns on P2 and turns off N2. Although N2 is turned off, N1 is still on and PH3 is still low, so N3 stays off. With P1 still off, turning on P2 drives the gate of P3 to Vdd, which turns off P3. With CLKB previously high and N3 previously off, turning off P3 leaves the now-floating output CLK high.

At time t3, PH3 goes from low to high. With P1 off, the transition of PH3 has no effect on P3, which stays off due to P2 being on. However, with N1 on and N2 off, the transition of PH3 turns on N3, which pulls CLKB low.

At time t4, PH1 and PH3 are high, and PH2 is low. As such, P1, P3, and N2 are off, P2, N1, and N3 are on, and CLKB is low.

The state of CLKB for the clock transitions that occur at times t5-t7 of FIG. 4 can be determined in an analogous manner.

Table I demonstrates that, at no time during the operations of inverter 300, are both transistors P3 and N3 on or even partially on. In particular, after P3 has been on and N3 has been off (e.g., at time t0), P3 is turned off (e.g., at time t2) before N3 is turned on (e.g., at time t3). Similarly, after P3 has been off and N3 has been on (e.g., at time t4), N3 is turned off (e.g., at time t6) before P3 is turned back on (e.g., at time t7). As such, no crowbar current exist in inverter 300 of FIG. 3.

Note that, as represented in both FIGS. 4 and 5, clock signal CLKB is substantially an inverted version of clock signal PH3, except that the transitions in CLKB are much steeper (i.e., higher slew rate) than the transitions in PH3. In particular, when PH3 transitions from low to high at time t3, CLKB quickly transitions from high to low, and, when PH3 transitions from high to low at time t7, CLKB quickly transitions from low to high. Since the slew rate of CLKB is much faster than the slew rates of PH1, PH2, and PH3, there is less likelihood that crowbar currents will exist in any inverters or other similar circuitry that is driven based on CLKB.

Transistors P1, P2, N1, and N2 of inverter 300 may be said to be part of control circuitry that receives the three phase-offset clock signals PH1, PH2, and PH3 and prevents crowbar current from occurring in the cascode circuitry of transistors P3 and N3, which forms an output driver stage of inverter 300. Transistors P1 and N1 function as pass transistors in a common-gate configuration that selectively allows clock signal PH3 to be applied directly to the gate of either transistor P3 or transistor N3, depending on the phasing of clock signals PH1. Transistor P2 functions as a pull-up device that ensures that transistor P3 is off when clock signal PH2 is low. Similarly, transistor N2 functions as a pull-down device that ensures that transistor N3 is off when clock signal PH2 is high. Those skilled in the art will understand that other configurations of the same or different numbers of transistors can be employed with the same or different numbers of phase-offset clock signals to implement analogous control circuitry for P3 and N3.

As shown in FIG. 4, clock signals PH1 is fully high, when clock signal PH3 transitions from low to high, and PH1 is fully low, when PH3 transitions from high to low. This relative phasing of clock signals PH1 and PH3 ensures that pass transistor N1 is turned fully on before clock signal PH3 transitions from low to high. As such, the low-to-high transition in PH3 will be applied to the gate of transistor N3 through pass transistor N1 will very little delay. In an analogous manner, the phasing of clock signals PH1 and PH3 ensures that pass transistor P1 is turned fully on before clock signal PH3 transitions from high to low. As such, the high-to-low transition in PH3 will be applied to the gate of transistor P3 through pass transistor P1 will very little delay. As a result, inverter 300 is able to properly operate over a much wider range of input clock frequencies than are the comparable prior-art solutions described previously.

Figure 6:
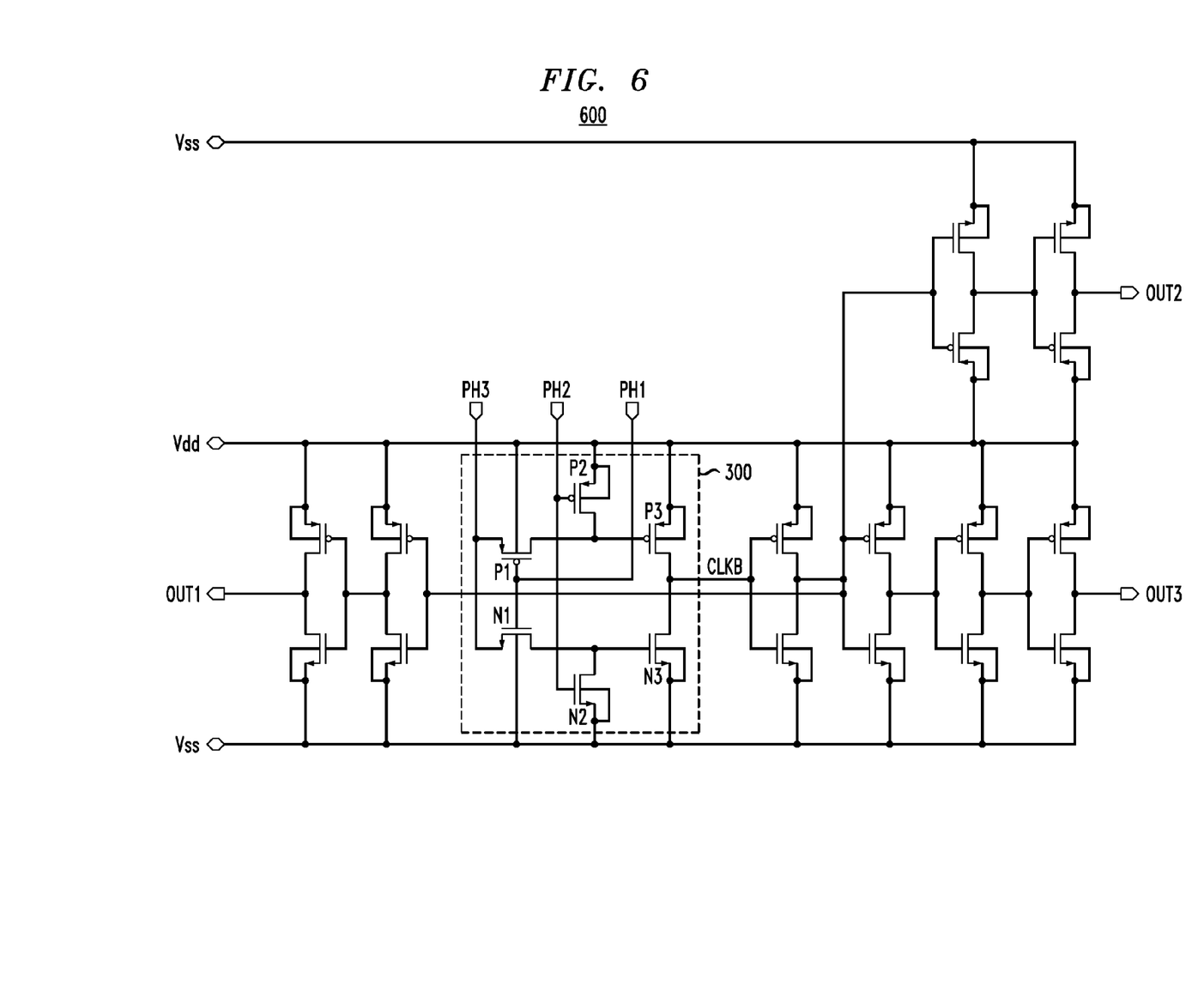
FIG. 6 is a schematic circuit diagram of an output buffer that includes an instance of the inverter of FIG. 3.

Inverter 300 of FIG. 3 can be used in any suitable context that is susceptible to undesirable crowbar current. For example, FIG. 6 is a schematic circuit diagram of an output buffer 600 that includes an instance of inverter 300. Those skilled in that art will understand that output buffer 600 includes a toggle flip-flop formed from a standard flip-flop cell and a number of feedback inverters. Note that, as shown in FIG. 6, since the output clock signal CLKB has relatively steep transitions, the downstream feedback inverters in output buffer 600 can be implemented using instances of prior-art inverter 100 of FIG. 1.

Figure 7:
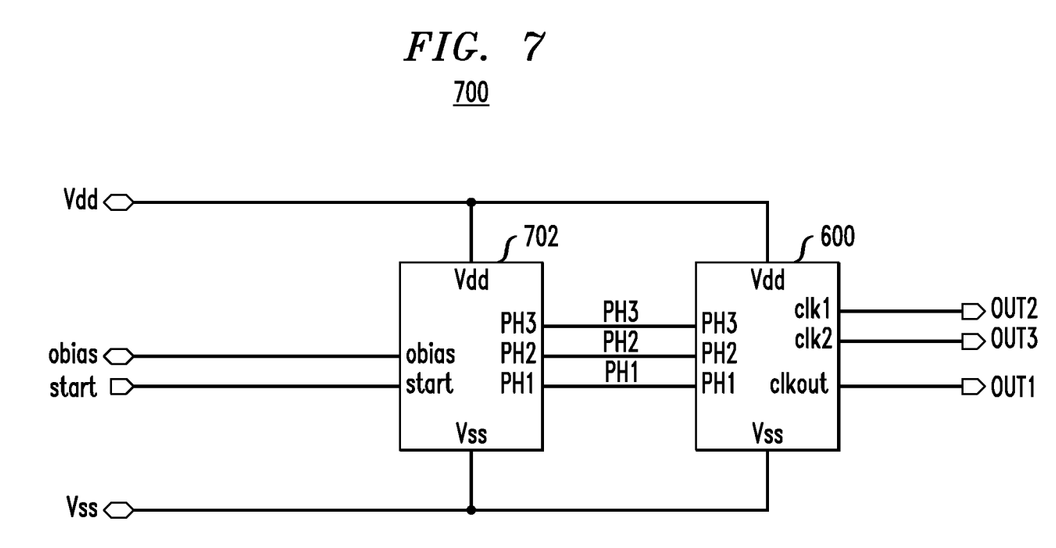
FIG. 7 is a block diagram of an oscillator subsystem that includes an instance of the output buffer of FIG. 6.

Output buffer 600 of FIG. 6 may be used in any suitable context that is susceptible to undesirable crowbar current. For example, FIG. 7 is a block diagram of an oscillator subsystem 700 that includes an instance of output buffer 600 of FIG. 6. Oscillator subsystem 700 also includes a current-controlled oscillator (ICO) 702 that generates the three phase-offset clock signals PH1, PH2, and PH3 that are applied to inverter 300 of output buffer 600 based on an applied bias current obias.

Figure 8:
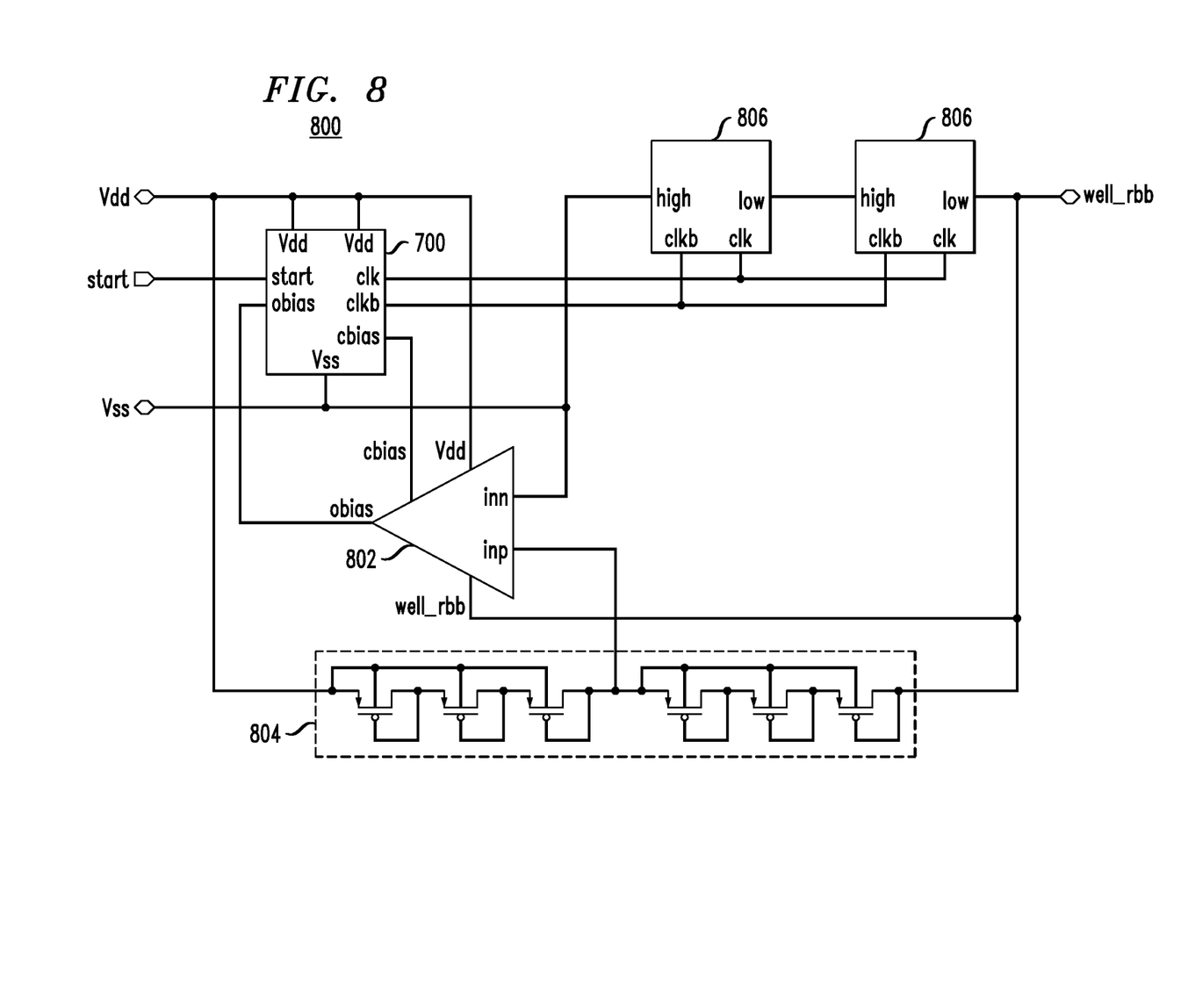
FIG. 8 is a schematic block diagram of a reverse back bias (RBB) charge pump that includes an instance of the oscillator subsystem of FIG. 7.

Oscillator subsystem 700 of FIG. 7 may be used in any suitable context that is susceptible to undesirable crowbar current. For example, FIG. 8 is a schematic block diagram of a reverse back bias (RBB) charge pump 800 that includes an instance of oscillator subsystem 700 of FIG. 7. RBB charge pump 800 also includes a comparator 802, a voltage divider 804, and two pump stages 806.

Figure 9:
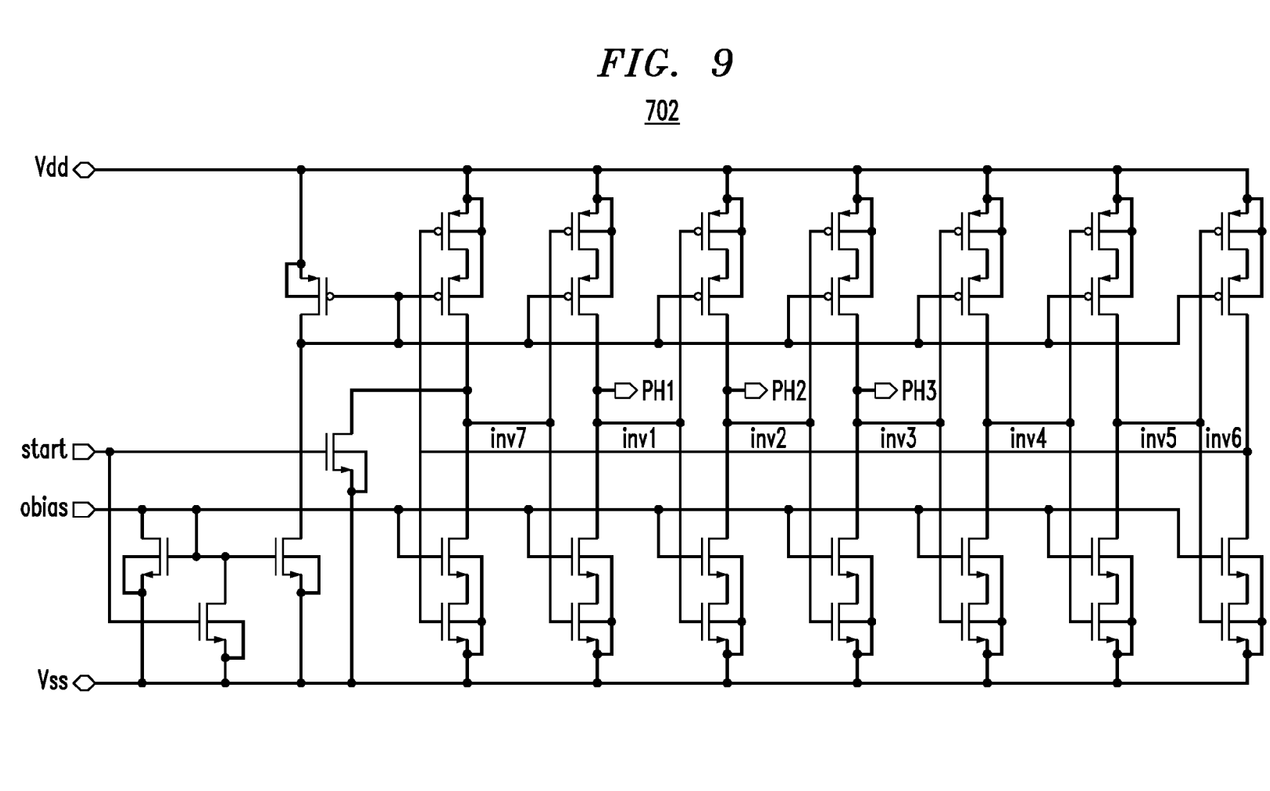
FIG. 9 is a schematic circuit diagram of the current-controlled oscillator of FIG. 7.

FIG. 9 is a schematic circuit diagram of current-controlled oscillator 702 of FIG. 7 according to one possible implementation of oscillator subsystem 700 of FIG. 7. ICO 702 is a seven-stage ring oscillator in which the outputs of three of the nine stages are the three phase-offset clock signals PH1, PH2, and PH3. ICO 702 functions as an input generator for the output buffer 600 of FIG. 6 and/or for the inverter 300 of FIG. 3. Those skilled in the art will understand that there are many other ways of implementing input generators for the invention. For example, FIG. 10 is a schematic circuit diagram of a five-stage delay chain 1000 that can be used to generate the three phase-offset clock signals PH1, PH2, and PH3 for inverter 300 of FIG. 3 and/or output buffer 600 of FIG. 6.

Figure 10:
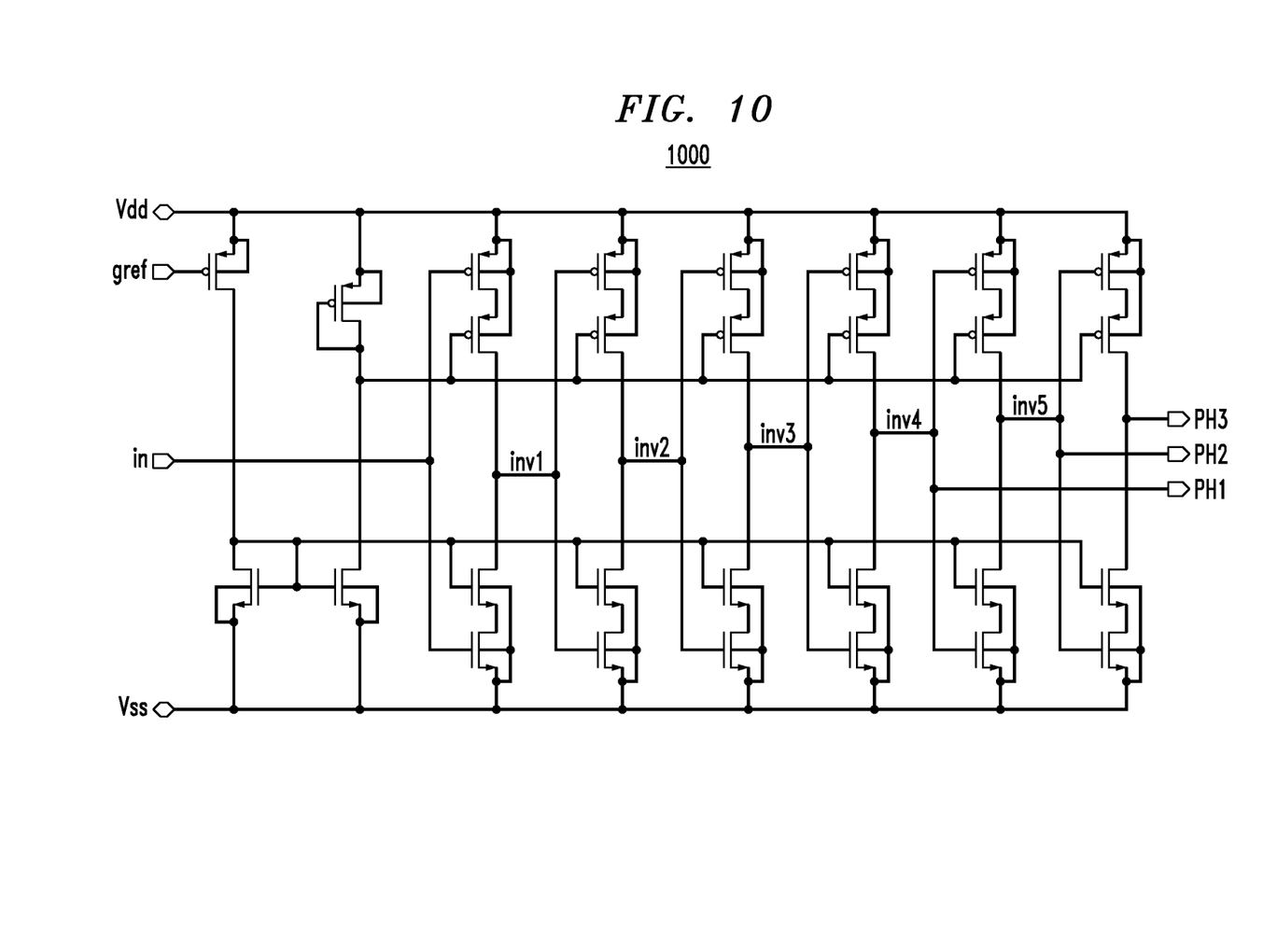
FIG. 10 is a schematic circuit diagram of a delay chain that can be used to generate the phase-offset clock signals for the inverter of FIG. 3 and/or the output buffer of FIG. 6.

Under certain circumstances, ICO 702 of FIG. 9 and delay chain 1000 of FIG. 10, are known to momentarily stop generating oscillating output signals. Typically, an output clock signal from such a stopped clock generator will be held either low at Vss or high at Vdd until the oscillation resumes. When such a stopped clock signal is applied to a conventional inverter, like inverter 100 of FIG. 1, crowbar current can occur due to leakage currents in the inverter transistors.

The inverter 300 of FIG. 3 avoids such crowbar currents when its input generator momentarily stops generating oscillating output signals. In one possible "stopped clock" situation, clock signals PH1 and PH3 will initially be low at Vss and clock signal PH2 will initially be high at Vdd. This is the situation at times t0 and t8 of FIGS. 4 and 5. In that case, transistors P1, P3, and N2 will be on, transistors P2, N1, and N3 will be off, and CLKB will be high. Even if leakage currents cause PH1 and PH3 to drift above Vss and PH2 to drift below Vdd, transistor N2 will still be sufficiently turned on to ensure that the gate of transistor N3 is driven close enough to Vss to keep N3 turned off, thereby avoiding any crowbar current in that situation.

In another possible "stopped clock" situation, clock signals PH1 and PH3 will initially be high at Vdd and clock signal PH2 will initially be low at Vss. This is the situation at time t4 of FIGS. 4 and 5. In that case, transistors P1, P3, and N2 will be off, transistors P2, N1, and N3 will be on, and CLKB will be low. Even if leakage currents cause PH1 and PH3 to drift below Vdd and PH2 to drift above Vss, transistor P2 will still be sufficiently turned on to ensure that the gate of transistor P3 is driven close enough to Vdd to keep P3 turned off, thereby avoiding any crowbar current in that situation.

Although the invention has been described in the context of inverters that invert clock signals, it will be understood that the invention can also be applied in the context of inverters that invert signals other than clock signals, where the inverters are susceptible to undesirable crowbar currents due to input signals having relatively slow transitions in one or both directions. In those implementations, three phase-offset versions of each input signal will be employed.

Furthermore, although the invention has been described in the context of inverters, it will be understood that the invention can also be applied in the context of other suitable circuits having one or more P-type transistors connected in cascode to one or more N-type transistors that are also susceptible of undesirable crowbar currents due to input signals having relatively slow transitions in one or both directions. Here, too, three phase-offset versions of each input signal will be employed.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

Integrated circuits have become increasingly complex. Entire systems are constructed from diverse integrated circuit sub-systems. Describing such complex technical subject matter at an appropriate level of detail becomes necessary. In general, a hierarchy of concepts is applied to allow those of ordinary skill to focus on details of the matter being addressed.

Describing portions of a design (e.g., different functional units within an apparatus or system) according to functionality provided by those portions is often an appropriate level of abstraction, since each of these portions may themselves comprise hundreds of thousands, hundreds of millions, or more elements. When addressing some particular feature or implementation of a feature within such portion(s), it may be appropriate to identify substituent functions or otherwise characterize some sub-portion of that portion of the design in more detail, while abstracting other sub-portions or other functions.

A precise logical arrangement of the gates and interconnect (a netlist) implementing a portion of a design (e.g., a functional unit) can be specified. How such logical arrangement is physically realized in a particular chip (how that logic and interconnect is laid out in a particular design) may differ in different process technologies and/or for a variety of other reasons. Circuitry implementing particular functionality may be different in different contexts, and so disclosure of a particular circuit may not be the most helpful disclosure to a person of ordinary skill. Also, many details concerning implementations are often determined using design automation, proceeding from a high-level logical description of the feature or function to be implemented. In various cases, describing portions of an apparatus or system in terms of its functionality conveys structure to a person of ordinary skill in the art. As such, it is often unnecessary and/or unhelpful to provide more detail concerning a portion of a circuit design than to describe its functionality.

Functional modules or units may be composed of circuitry, where such circuitry may be fixed function, configurable under program control or under other configuration information, or some combination thereof. Functional modules themselves thus may be described by the functions that they perform, to helpfully abstract how some of the constituent portions of such functions may be implemented. In some situations, circuitry, units, and/or functional modules may be described partially in functional terms, and partially in structural terms. In some situations, the structural portion of such a description may be described in terms of a configuration applied to circuitry or to functional modules, or both.

Configurable circuitry is effectively circuitry or part of circuitry for each different operation that can be implemented by that circuitry, when configured to perform or otherwise interconnected to perform each different operation. Such configuration may come from or be based on instructions, microcode, one-time programming constructs, embedded memories storing configuration data, and so on. A unit or module for performing a function or functions refers, in some implementations, to a class or group of circuitry that implements the functions or functions attributed to that unit. Identification of circuitry performing one function does not mean that the same circuitry, or a portion thereof, cannot also perform other functions concurrently or serially.

Although circuitry or functional units may typically be implemented by electrical circuitry, and more particularly, by circuitry that primarily relies on transistors fabricated in a semiconductor, the disclosure is to be understood in relation to the technology being disclosed. For example, different physical processes may be used in circuitry implementing aspects of the disclosure, such as optical, nanotubes, micro-electrical mechanical elements, quantum switches or memory storage, magnetoresistive logic elements, and so on. Although a choice of technology used to construct circuitry or functional units according to the technology may change over time, this choice is an implementation decision to be made in accordance with the then-current state of technology.

Embodiments according to the disclosure include non-transitory machine readable media that store configuration data or instructions for causing a machine to execute, or for configuring a machine to execute, or for describing circuitry or machine structures (e.g., layout) that can execute or otherwise perform, a set of actions or accomplish a stated function, according to the disclosure. Such data can be according to hardware description languages, such as HDL or VHDL, in Register Transfer Language (RTL), or layout formats, such as GDSII, for example.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. Circuitry comprising:
    a first P-type transistor and a first N-type transistor, wherein drains of the first P-type transistor and the first N-type transistor are electrically connected, a source node of the first P-type transistor is coupled to a supply node, and a source of the first N-type transistor is coupled to a sink node; and
    control circuitry connected to generate gate voltages for the first P-type and N-type transistors based on a plurality of phase-offset clock signals comprising a first clock signal, a second clock signal that falls after the first clock signal rises and rises after the first clock signal falls; and a third clock signal that rises after the second clock signal falls and falls after the second clock signal rises,
    a second P-type transistor whose (i) gate is connected to receive the second clock signal, (ii) source is connected to the supply node, and (iii) drain is connected to the gate of the first P-type transistor;
    a second N-type transistor whose (i) gate is connected to receive the second clock signal, (ii) source is connected to the ground node, and (iii) drain is connected to the gate of the first N-type transistor;
    a third P-type transistor whose (i) gate is connected to receive the first clock signal, (ii) source is connected to receive the third clock signal, and (iii) drain is connected to the gate of the first P-type transistor; and
    a third N-type transistor whose (i) gate is connected to receive the first clock signal, (ii) source is connected to receive the third clock signal, and (iii) drain is connected to the gate of the first N-type transistor wherein the control circuitry comprises pass-transistor circuitry that selectively allows one of the phase-offset input signals to be applied either to a gate of the first P-type transistor or a gate of the first N-type transistor.

2. The circuitry of claim 1, wherein:
    the pass-transistor circuitry comprises a P-type pass transistor connected to an N-type pass transistor in a common-gate configuration;
    the sources of the pass transistors are connected to receive the one of the phase-offset input signals; and
    the gates of the pass transistors are connected to receive another of the phase-offset input signals.

3. The circuitry of claim 2, wherein the drains of the pass transistors are respectively connected directly to the gates of the first transistors.

4. The circuitry of claim 2, wherein (i) a body of the P-type pass transistor is connected to a supply node and (ii) a body of the N-type pass transistor is connected to a sink node.

5. The circuitry of claim 1, wherein the sink node is a ground node.

6. The circuitry of claim 1, wherein the first, second, and third P-type transistors and the first, second, and third N-type transistors form an inverter.

7. The circuitry of claim 1, wherein the first P-type and N-type transistors and the control circuitry are part of an inverter.

8. The circuitry of claim 7, further comprising an output buffer comprising the inverter.

9. The circuitry of claim 8, further comprising an oscillator subsystem comprising the output buffer.

10. The circuitry of claim 9, further comprising a reverse back bias (RBB) charge pump comprising the oscillator subsystem.

11. The circuitry of claim 9, wherein the oscillator subsystem comprises a ring oscillator that generates the phase-offset clock signals applied to the control circuitry.

12. The circuitry of claim 1, further comprising an input generator that generates the phase-offset input signals.

13. The circuitry of claim 12, wherein:
the phase-offset input signals are phase-offset clock signals; and
the input generator comprises an oscillator or delay chain that generates the phase-offset clock signals.

14. A method of controlling a Complementary Metal Oxide Semiconductor (CMOS) output buffer circuit comprising a first P-type transistor and a first N-type transistor, wherein drains of the first P-type transistor and the first N-type transistor are electrically connected, a source node of the first P-type transistor is coupled to a supply node, and a source of the first N-type transistor is coupled to a sink node, the method comprising:
providing a plurality of input signals that have substantially the same transition pattern and frequency, but are offset in phase relative to each other;
applying a first of the plurality of input signals either to a gate of the first P-type transistor or to a gate of the first N-type transistor;
controlling whether to apply the first of the plurality of input signals either to the gate of the first P-type transistor or to the gate of the first N-type transistor using a second one of the plurality of input signals, comprising applying the second one of the plurality of input signals to electrically coupled gates of a complementary pass transistor set and applying the first of the plurality of input signals to sources of the complementary pass transistor set; and
applying a third of the plurality of input signals to respective gates of (i) a pullup transistor coupled between the supply node and the gate of the first P-type transistor and (ii) a pulldown transistor coupled between a sink node and the gate of the first N-type transistor.

15. The method of claim 14, further comprising obtaining the plurality of input clock signals from different nodes in a multistage ring oscillator.

* * * * *